United States Patent
Harting et al.

(10) Patent No.: US 6,203,380 B1
(45) Date of Patent: Mar. 20, 2001

(54) CODING ARRANGEMENT

(75) Inventors: Dietmar Harting, Espelkamp; Günter Pape, Enger; Frank Weichert, Lübbecke; Andreas Kohler, Minden, all of (DE)

(73) Assignee: Harting KGaA (DE)

( * ) Notice: Subject to any disclaimer, the term of this patent is extended or adjusted under 35 U.S.C. 154(b) by 0 days.

(21) Appl. No.: 09/586,707

(22) Filed: Jun. 1, 2000

(30) Foreign Application Priority Data

Jun. 2, 1999 (DE) .................................... 199 25 347

(51) Int. Cl.[7] .......................... H01R 13/64; H01R 13/28; H01R 25/00
(52) U.S. Cl. ............................. 439/680; 439/293
(58) Field of Search .................. 439/680, 681, 439/284, 290, 292, 293; 361/415, 785

(56) References Cited

U.S. PATENT DOCUMENTS

| | | | |
|---|---|---|---|
| 5,019,947 | * 5/1991 | Pelzl | 361/802 |
| 5,030,141 | * 7/1991 | Winstein et al. | 439/680 |
| 5,096,443 | * 3/1992 | Myrick et al. | 439/681 |
| 5,392,194 | 2/1995 | Zell et al. | 361/785 |
| 5,769,668 | * 6/1998 | Tondreault | 439/633 |

FOREIGN PATENT DOCUMENTS

| | | |
|---|---|---|
| 84 28 477 U1 | 4/1986 | (DE) . |
| 195 00 156 A1 | 7/1995 | (DE) . |

* cited by examiner

*Primary Examiner*—Paula Bradley
*Assistant Examiner*—Edwin A. León
(74) *Attorney, Agent, or Firm*—Cook, Alex, McFarron, Manzo, Cummings & Mehler Ltd.

(57) ABSTRACT

For the mechanical coding of parts which can be joined together, it is proposed that the parts be connected to, in each case, one of two coding elements which belong together, the said coding elements being constructed as a one-piece coding module and being held together by means of web-like connections, and the connectable parts being divided up, after being joined together, into two coded releasable parts.

5 Claims, 7 Drawing Sheets

US 6,203,380 B1

CODING ARRANGEMENT

The invention relates to a coding arrangement for parts which can be joined together mechanically, in particular circuit board plug connectors, the parts to be connected being provided, in each case, with at least one coding element, and the said invention also relates to a method of coding two parts which can be joined together mechanically.

The coding of parts which can be joined together mechanically, such as plug connections for example, is necessary in order to be able to carry out non-interchangeable replacement or exchanging of the said parts, and in order to ensure functionality of the units, for example electrical control systems on circuit boards, which are connected to the said parts.

It is known practice to equip circuit board plug connectors with mechanical coding arrangements in order to prevent confusion between different circuit boards. In doing so, pins, small discs or other shaped parts are fitted into or onto corresponding recesses inside or outside a plug connection in such a way that the plugging-in of an incorrectly coded plug connection is prevented.

With the increasing miniaturisation of plug connectors, the known coding arrangements are becoming problematical, since the corresponding coding arrangements have to be designed in an ever smaller and more precise manner, it being necessary, in some cases, to plug them in, and remove them again, with a special tool.

There is also the danger that relatively small coding arrangements will be destroyed in the event of a forcible plugging-in operation, and their protective effect will no longer be guaranteed.

The underlying object of this invention, therefore, is to so construct a coding arrangement for coding parts of the type initially mentioned which can be connected mechanically, that reliable coding of the connection occurs in conjunction with simple mounting without tools.

This object is achieved through the fact that two coding elements at a time, which belong together, are constructed as a one-piece coding module, the said coding elements being held together by means of web-like connections.

Advantageous refinements are indicated in claims 2 to 4. Claim 5 indicates a method of coding two parts which can be joined together mechanically.

The advantages achieved with the invention consist, in particular, in the fact that the coding arrangement for coding parts which can be connected mechanically, such as, inter alia, circuit board plug connectors, is first of all connected to one circuit board during mounting, and then pressed onto the other circuit board, when the plug connection is plugged together, by means of a fastening means on the coding arrangement. During the pressing operation, the webs with which the two coding elements are held together to form a coding module break, and the connection is releasable again and, at the same time, coded. It is of advantage, in this connection, that no special tool is needed for this operation. It is also of advantage that no mechanical destruction of the coding elements during a plugging-in operation is to be expected, because of the solid and stable design of the coding modules, the shape and colour of which can be selected at will.

It is particularly advantageous that manual breaking-off or breaking-out of coding elements is eliminated when the intention is to coordinate with one another the coding of the plug connectors, that belong together, of two circuit boards.

It is also of advantage that faulty coding of the plug connectors, such as can occur in the event of the separate or independent production of circuit boards that belong together, is avoided since, in the final finishing of appliances of this type equipped with coded plug connectors, final mounting is carried out by suitably skilled specialists, in the case of whom faulty plugging-in can be precluded to a very large extent.

In the method according to the invention, it is of advantage that the coding module is first of all fastened to one of the connectable parts and, during the operation of joining the latter together with the other part, is fixedly connected to the said other part in an automatic manner, the two coding elements being separated at the same time as the joining-together operation, so that the parts joined together can be separated again, now in a coded design.

An exemplified embodiment is represented in the drawings and will be explained in greater detail below. In the drawings.

Coding modules, which are intended for coding a circuit board plug connector, are represented in various forms of embodiment in FIGS. 1 to 4. In these forms of embodiment, the shaping of the different coding keys is essentially of any desired kind, and can be adapted to the required conditions. The coding module 1 in FIG. 4, for example, is designed as a parallelepipedal block and consists of two parts, the coding elements 2 and 3, which are connected to one another by web-like connections 4. In this case, the coding elements are kept separate from one another at a uniform distance, or by a gap 9, the orientation of the web-like connections 4 being preferably designed so as to be perpendicular to the direction of plugging-in. If a compressive force is exerted on the coding elements in the direction of plugging-in until the said coding elements, which are initially spaced apart by the gap 9, impinge upon one another in a form-locking manner, the web-like connections 4 break and the coding module 1 is divided up into two individual coding elements 2 and 3.

Figure 4:
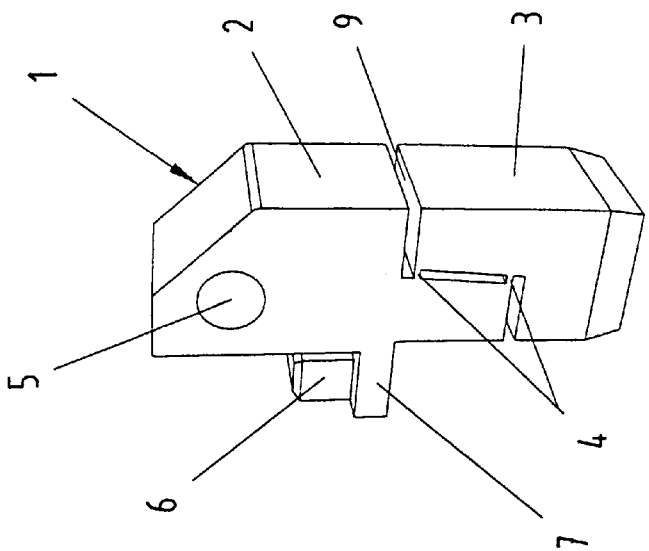
FIGS. 1–4 show coding modules with different coding designs.
Figure 3:
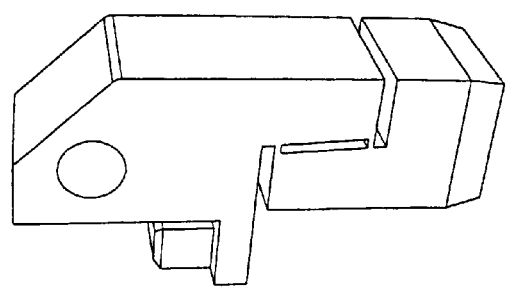
Figure 2:
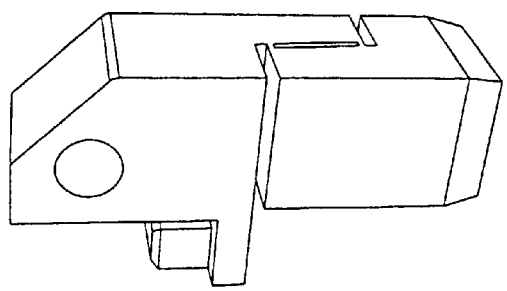
Figure 1:
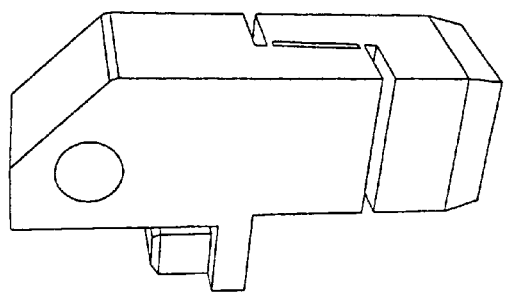

A projection 7, on which a guide element 6 is disposed, is moulded onto the block, which is represented in FIG. 4, of the coding module 1, on one side and approximately centrally to the overall height of the said coding module. When the coding module is mounted on a circuit board 10, this guide element 6 projects into a corresponding recess 14 in a circuit board plug connector 12 and serves initially for the pre-mounting of the coding module 1 and circuit board plug connector 12 before the coding module is fastened, by the coding element 2, to a circuit board 10 through a bore 5 by means of a fastening means 18 (in this connection, see also FIG. 10).

Figure 5:
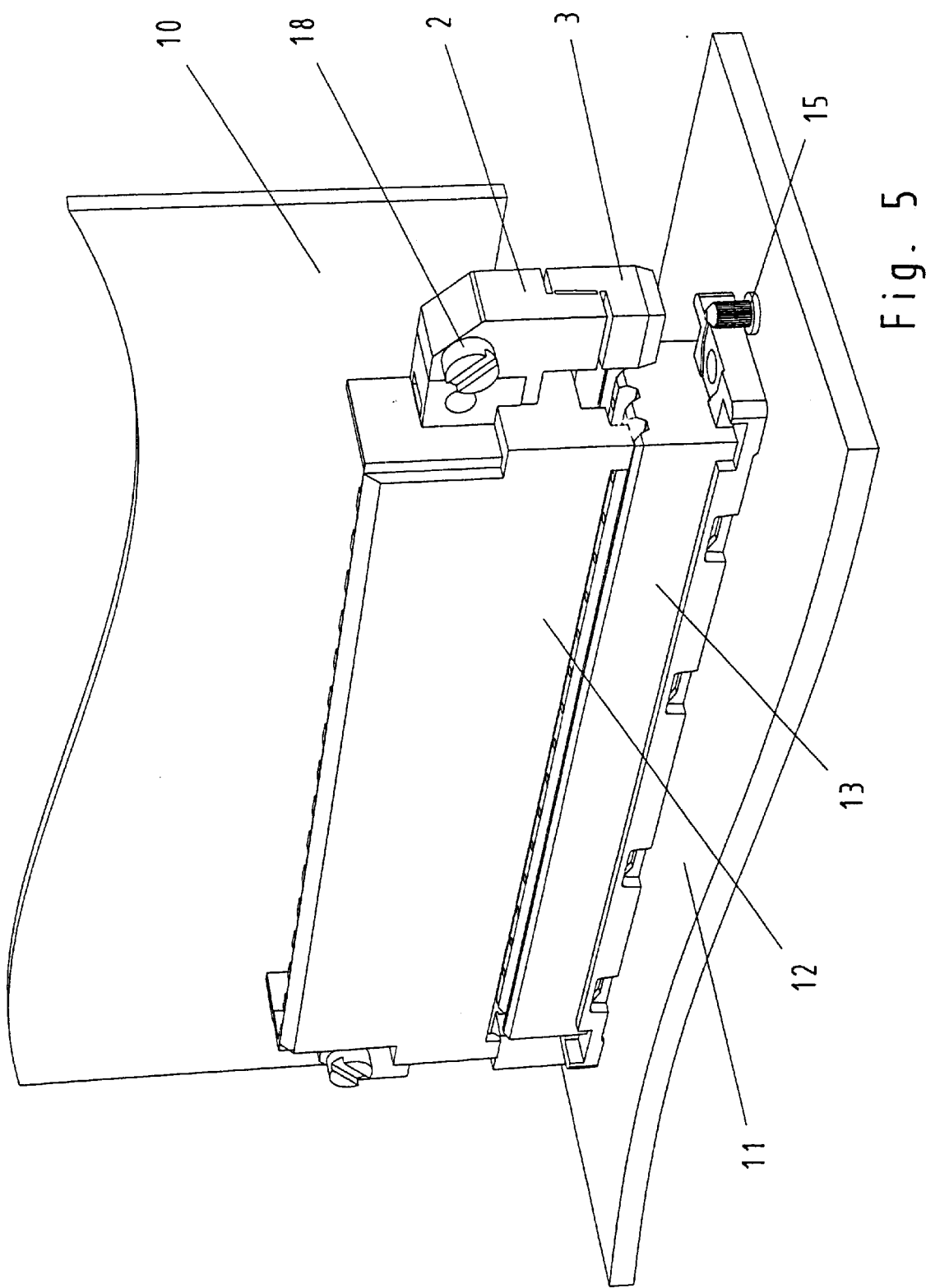
FIGS. 5–7 show a sequence involving the mounting of circuit board plug connectors with coding elements.
Figure 6:
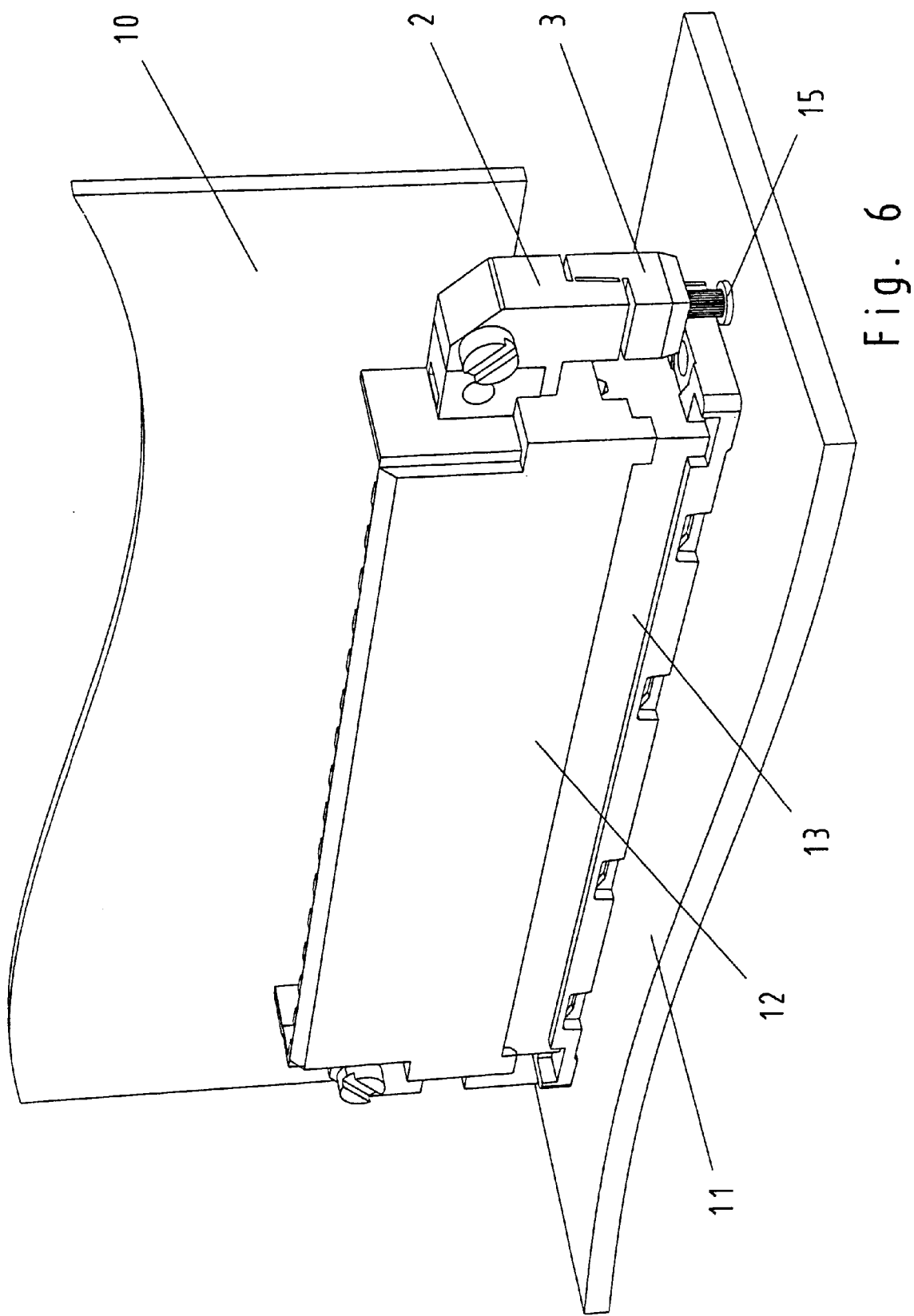
Figure 7:
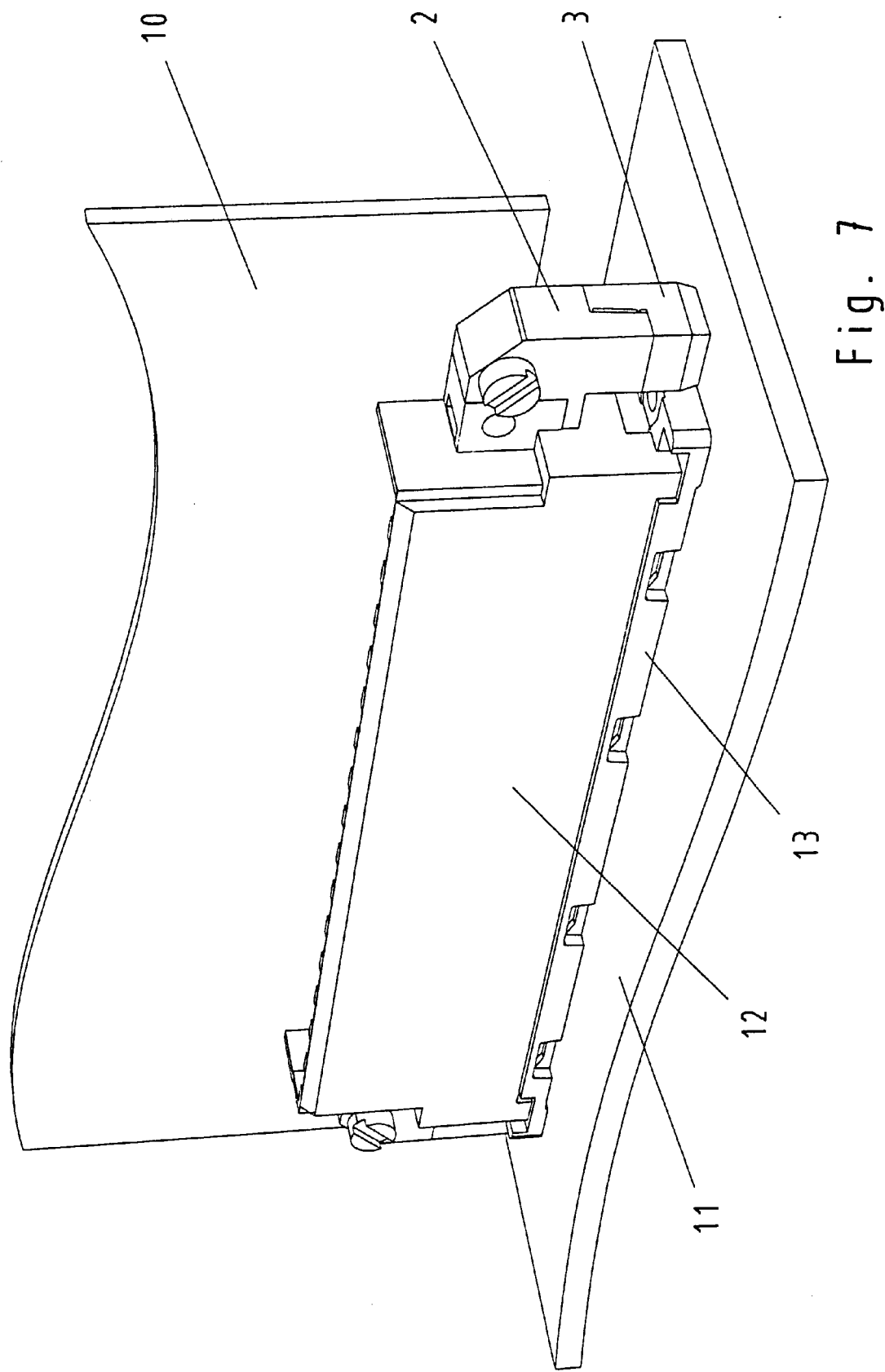

The operation of joining-together a circuit board plug connection consisting of the plug connectors 12, 13 on the circuit boards 10, 11, and a coding module 1, is represented in FIGS. 5, 6 and 7. In this case, provision is made for a fastening element 15, which is constructed as a pin and which will subsequently be pressed into a bore 8 in the base of the coding element 3, to already be pre-mounted on the circuit board 11.

In the exemplified embodiment, two coding modules 1 are fastened to the circuit board 10 on either side of a circuit board plug connector 12. If the plug connectors 12, 13 of the circuit boards 10, 11 are plugged together, the pin 15 is pressed permanently into the corresponding bore 8 in the coding element 3 (FIG. 6 and FIG. 7). During the operations involving the plugging-in of the plug connectors 12, 13 and the simultaneous pressing-in of the pin 15 into the bore 8 in the coding element 3, the web-like connections 4 between the two coding elements are stretched until they break, because of the compressive forces that occur, and the two coding elements are tightly joined to one another (FIG. 7). The connection between the coding elements 2, 3 that belong together is thereby severed, and automatic coding of the plug connection has taken place. The plug connection between the circuit board 10 and the circuit board 11 can be immediately released again if necessary, the coding subsequently only permitting the connection of circuit boards in this combination of plug connector and coding element.

Figure 8:
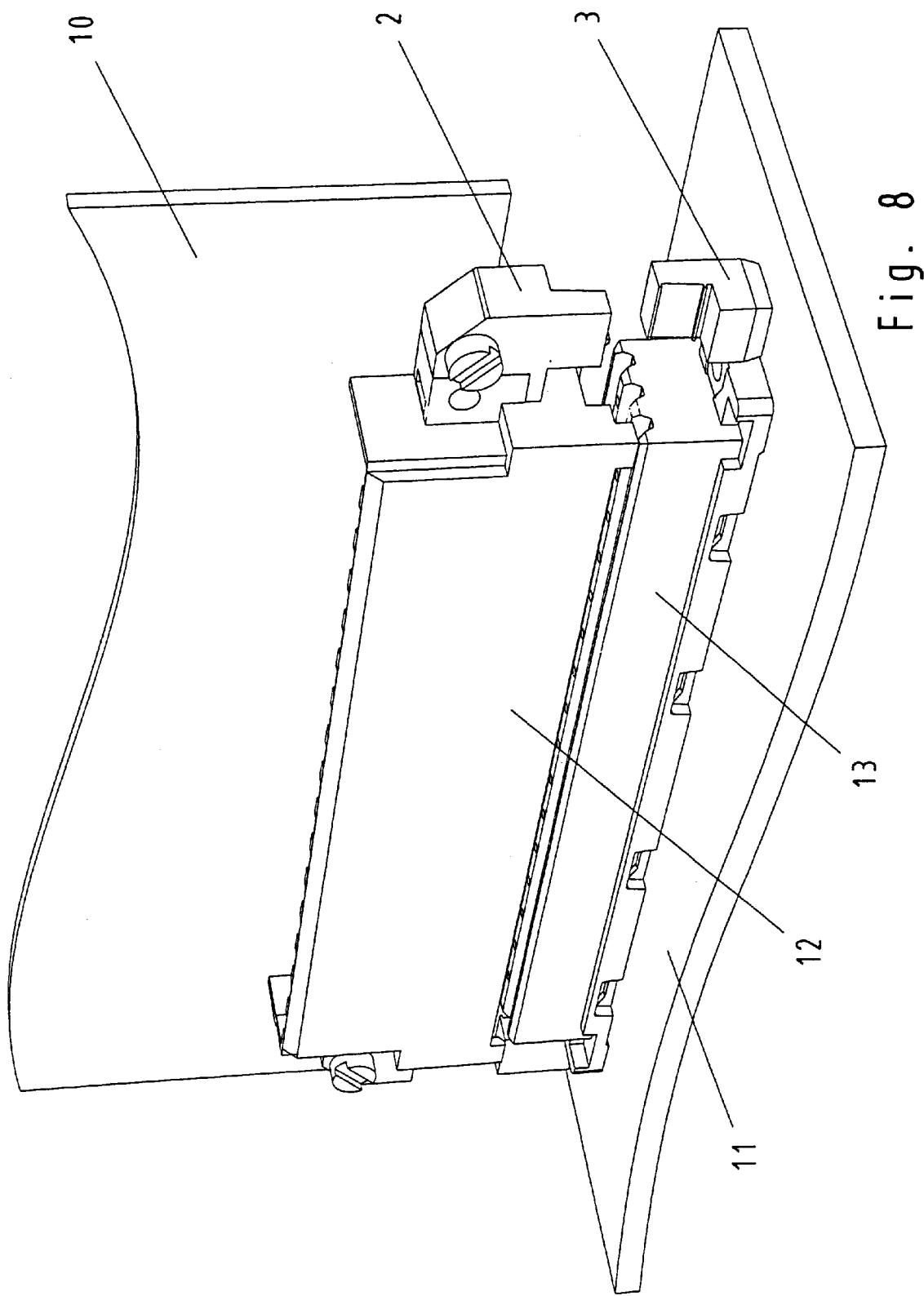
FIG. 8 shows an operation involving the severing of a coded circuit board plug connection.

FIG. 8 shows an operation involving the severing of a coded plug connection, the coding element 3 remaining fixedly on the circuit board 11 with the plug connector 13, while the coding element 2 is fastened to the circuit board 10 with the plug connection 12.

Figure 9:
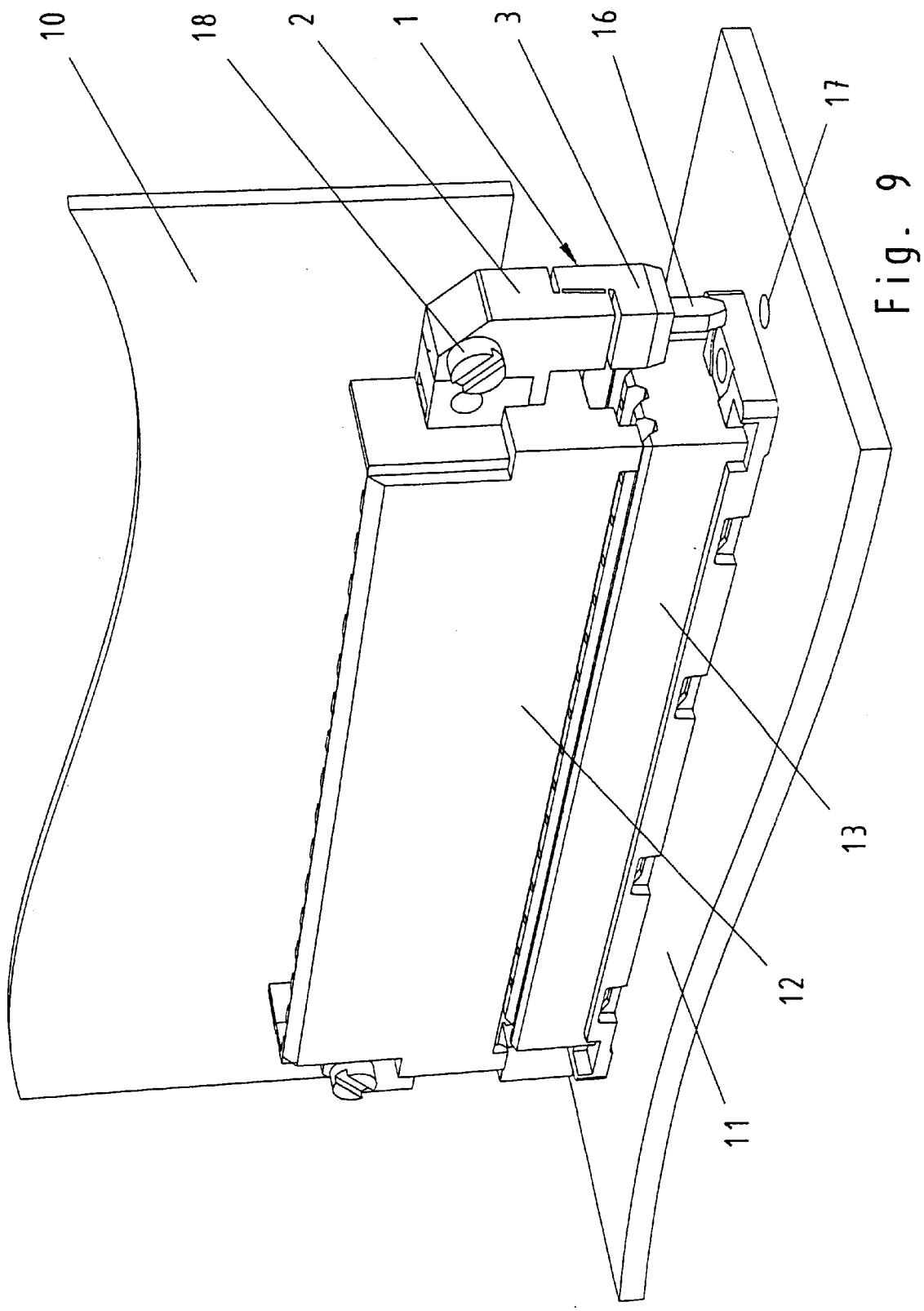
FIG. 9 shows a view of a mounted, modified coding module.

A variant of the above-described mounting of the coding modules is represented in FIG. 9. In this case, provision is made for a correspondingly disposed bore 17 to be provided in the circuit board 11, so that a press-in pin 16, which is let fixedly into the coding element 3 of the coding module 1, or is even moulded on, can be pressed into the bore 17. In the case of this type of mounting, the coding module 1 is, first of all, likewise fixed on the circuit board 10 by means of the fastening means 18, and the plug connectors 12, 13 on the circuit boards 10, 11 are plugged into one another. In the process, the mounted press-in pin 16 is pressed permanently into the bore 17 provided in the circuit board 11, and the web-like connections 4 break and release the connection between the coding elements 2 and 3.

Figure 10:
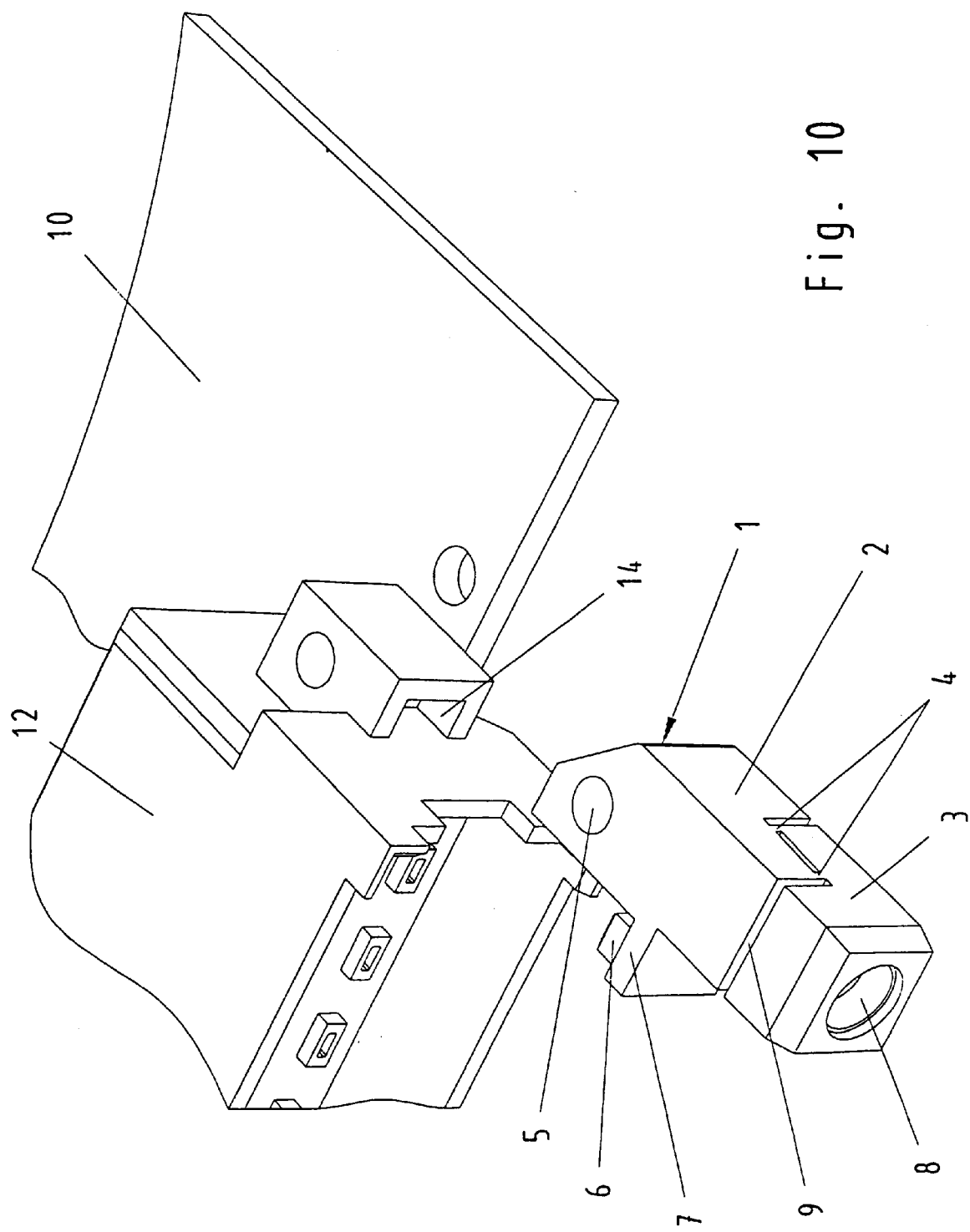
FIG. 10 shows a detail view of a coding module and of a circuit board plug connector, prior to mounting on a circuit board.

In FIG. 10, a circuit board plug connector 12 and a coding module 1 are represented in a detail drawing, prior to being mounted on a circuit board 10. Here, it is once again possible to clearly make out the guide element 6 on the projection 7, which guide element hooks into the recess 14 on the circuit board plug connector 12 and produces a reliable and stable connection to the circuit board 10 through the bore 5 in the coding element 2 by means of a fastening means 18 which is not represented here.

A description will be given below of a method of coding two parts 10, 11 which can be joined together mechanically, a coding module 1, which consists of two coding elements 2, 3 and is held together with web-like connections 4, being connected to the parts 10, 11. In this case, the coding element 2 is first of all fastened to the first part 10. The parts 10 and 11 are thereupon joined together, the coding element 3 being simultaneously fixed on the second part 11 with the aid of the fastening means 15. As a result of a compressive force which is further applied to the parts 10 and 11 which have been joined together, the coding elements 2, 3, which are kept spaced apart by the webs 4, are pressed against one another so that the said webs are sheared off and break, and at the same time the coding element 3 is permanently fastened on the second part 11 by means of the fastening means 15. This gives rise to a releasable and coded connection between the first and second parts 10, 11, the second part 11 remaining connected to the coding element 3, and the first part 10 to the coding element 2.

What is claimed is:

1. Coding arrangement for parts which can be joined together mechanically, an electrically each of the parts to be joined together being provided, with 2 coding element, characterised in that said coding elements (2,3), are constructed as a one-piece coding module (1), said coding elements being held together by means of web-like connections (4).

2. Coding arrangement according to claim 1, characterised in that the coding elements (2,3) of the coding module (1) are kept spaced apart by the web-like connections (4).

3. Coding arrangement according to claim 1, characterised in that the coding module (1) is held, by the fastening of one of the coding elements (2) by means of a fastening means (18), on one of the parts (10) which can be joined together.

4. Coding arrangement according to claim 3, characterised in that, when the parts (10,11) are joined together, the other coding element (3) can be fastened to the other part (11) by means of fastening means (15).

5. Method of coding two parts which can be joined together mechanically, with the aid of a coding arrangement, characterised in that the coding module (1) is fastened, by the coding element (2), to the first part (10) which is to be connected, that, when the first and second parts (10, 11 ) are joined together, the other coding element (3) is fixed to the second part (11) by means of a fastening means (15), and that, as joining-together continues, the coding elements (2, 3) of the coding module (1), which are kept spaced apart by the webs (4), are pressed against one another, a compressive force being exerted on the webs so that the said webs (4) between the coding elements (2, 3) of the coding module (1) break as a result of the effect of the said compressive force, and the coding element (3) being fastened to the second part (11) by the fastening means (15).

* * * * *